(12) United States Patent
Hashi

(10) Patent No.: US 7,473,654 B2
(45) Date of Patent: Jan. 6, 2009

(54) METHOD OF FORMING AN OXIDE FILM, AN OXIDE FILM, A COMPONENT AND AN ELECTRONIC APPARATUS

(75) Inventor: Yukihiro Hashi, Nagano (JP)

(73) Assignee: Seiko Epson Corporation (JP)

( * ) Notice: Subject to any disclaimer, the term of this patent is extended or adjusted under 35 U.S.C. 154(b) by 323 days.

(21) Appl. No.: 11/199,421

(22) Filed: Aug. 8, 2005

(65) Prior Publication Data

US 2006/0046510 A1 Mar. 2, 2006

(30) Foreign Application Priority Data

Aug. 26, 2004 (JP) ............................. 2004-247407

(51) Int. Cl.
*H01L 21/44* (2006.01)
(52) U.S. Cl. ...................... 438/785; 438/758; 438/788; 257/E21.29
(58) Field of Classification Search ................ 438/758, 438/785, 788
See application file for complete search history.

(56) References Cited

U.S. PATENT DOCUMENTS

| | | | | |
|---|---|---|---|---|
| 2,938,808 A | * | 5/1960 | Duncan et al. ................. | 501/71 |
| 5,654,456 A | * | 8/1997 | Scott et al. ..................... | 556/28 |
| 6,368,485 B1 | | 4/2002 | Ue et al. | |
| 6,866,885 B1 | * | 3/2005 | Clough ........................ | 427/212 |
| 2002/0127415 A1 | * | 9/2002 | Standke et al. .............. | 428/447 |

FOREIGN PATENT DOCUMENTS

| | | |
|---|---|---|
| JP | 63-151029 * | 6/1988 |
| JP | 03-275462 | 12/1991 |
| JP | 05-226326 | 9/1993 |
| JP | 06-256969 | 8/1994 |
| JP | 06-256969 | 9/1994 |
| JP | 11-186866 | 7/1999 |
| JP | 11-209881 | 8/1999 |
| JP | 11-229157 | 8/1999 |
| JP | 2000-286658 | 10/2000 |
| JP | 2001-068957 | 3/2001 |
| JP | 2001-152391 | 6/2001 |
| JP | 2001-192842 | 7/2001 |
| JP | 2003-171774 | 6/2003 |

OTHER PUBLICATIONS

Communication from Japan Patent Office regarding counterpart application.

* cited by examiner

*Primary Examiner*—Alexander G Ghyka
(74) *Attorney, Agent, or Firm*—Harness, Dickey & Pierce, P.L.C.

(57) ABSTRACT

A method of forming an oxide film 3 on a surface of a base material 12 constituted from an inorganic material is disclosed. The oxide film 3 is constituted from a material containing an oxide of the inorganic material as a major component thereof. The method includes the steps of: preparing the base material 12; supplying a process liquid containing alcohol onto the surface of the base material 12 to form a liquid film 2 of the process liquid thereon; producing an oxide of the inorganic material through a reaction of the inorganic material with the alcohol in the liquid film 2; and eliminating the process liquid remaining in the liquid film 2 to form the oxide film 3 on the surface of the base material 12. Further, the oxide film 3 described above, a component including the oxide film 3, and an electronic apparatus including the component are disclosed.

14 Claims, 7 Drawing Sheets

METHOD OF FORMING AN OXIDE FILM, AN OXIDE FILM, A COMPONENT AND AN ELECTRONIC APPARATUS

CROSS-REFERENCE TO RELATED APPLICATION

This application claims priority to Japanese Patent Application No. 2004-247407 filed Aug. 26, 2004, which is hereby expressly incorporated by reference herein in its entirety.

FIELD OF THE INVENTION

The present invention relates to a method of forming an oxide film, an oxide film, a component and an electronic apparatus.

BACKGROUND OF THE INVENTION

Hitherto, as a method of forming metal oxide film on the surface of a metal substrate, an anodic oxidation method is well known (for example, see Japanese Laid-Open Patent Application Nos. 2001-68957 and 2001-152391). Now, in the anodic oxidation method, a predetermined voltage is applied to the metal substrate while the metal substrate is immersed in an acid bath in which an acid solution such as chromic acid, oxalic acid, sulfuric acid, or the like is fulfilled. For this reason, in the case of carrying out the anodic oxidation method, a power source and electrical wiring are required, and an operation thereof becomes complicated. In addition, power consumption becomes great, and this makes manufacturing costs thereof be increased. Further, there is a problem to tend to increase costs for the disposal of the acid solution.

Moreover, in the case where an oxide film with a plurality of patterns that are not connected to each other is formed by means of the anodic oxidation method, plural pieces of wiring for respectively applying a voltage to the plurality of patterns must be connected to a power source. Alternatively, after a series of pattern is formed and the anodic oxidation method is then carried out, the series of pattern must be divided to each of the plurality of patterns (patterning).

On the other hand, as a method of forming an oxide film on a silicon surface, various thermal oxidation methods such as a dry $O_2$ oxidation method, a wet $O_2$ oxidation method, and a steam oxidation method are mainly and widely utilized (for example, see Japanese Laid-Open Patent Application No. Hei. 5-226326).

However, since processing in each of these methods is carried out under high temperature of 600° C. or more, the energy consumption becomes great. Therefore, there is a problem that such a method cannot be applied to a substrate constituted from a material having a low melting point such as a resin substrate.

SUMMARY OF THE INVENTION

It is therefore an object of the present invention to provide a method of forming an oxide film which can form an oxide film easily.

It is another object of the present invention to provide an oxide film formed using the method of forming an oxide film, a component and an electronic device provided with the oxide film.

In order to achieve the above object, in one aspect of the present invention, the present invention is directed to a method of forming an oxide film on a surface of a base material constituted from an inorganic material. The oxide film is constituted from a material containing an oxide of the inorganic material as a major component thereof. The method includes the steps of:

preparing the base material;

supplying a process liquid containing alcohol onto the surface of the base material to form a liquid film of the process liquid thereon;

producing an oxide of the inorganic material through a reaction of the inorganic material with the alcohol in the liquid film; and eliminating the process liquid remaining in the liquid film to form the oxide film on the surface of the base material.

This makes it possible to form an oxide film easily.

In the method of forming an oxide film according to the present invention, it is preferable that in the supplying step the process liquid is supplied onto the surface of the base material while heating the base material.

This makes it possible to carry out the reaction of the inorganic material with the alcohol smoothly and surely. Thus, it is possible to shorten time for forming the oxide film.

In the method of forming an oxide film according to the present invention, it is preferable that the process liquid is supplied in a liquid state or a gas state.

This makes it possible to form the liquid film easily and surely.

In the method of forming an oxide film according to the present invention, it is preferable that the alcohol includes at least one of a monohydric alcohol, a dihydric alcohol and a trihydric alcohol.

These alcohols are compounds each having relatively high reactivity with the inorganic material.

In the method of forming an oxide film according to the present invention, it is preferable that the number of carbon atoms in one alcohol molecule of the alcohol is in the range of one to six.

These alcohols are compounds each having particular high reactivity with the inorganic material.

In the method of forming an oxide film according to the present invention, it is preferable that at least a part of hydrogen atoms included in a molecule of the alcohol other than a hydroxyl radical therein are replaced with fluorine atoms.

Fluoroalcohol is a compound having extremely high reactivity with the inorganic material.

In the method of forming an oxide film according to the present invention, it is preferable that the concentration of the alcohol in the process liquid is 95% by weight or more.

This makes it possible to produce the oxide efficiently.

In the method of forming an oxide film according to the present invention, it is preferable that the method further includes the step of forming a mask on the surface of the base material prior to the process liquid supplying step, the mask having an opening with a predetermined shape that corresponds to the shape of the oxide film to be formed.

This makes it possible to form the oxide film having a predetermined shape. Namely, it is possible to do patterning of the oxide film.

In the method of forming an oxide film according to the present invention, it is preferable that the mask includes a resist layer constituted from a resist material as a main material.

This makes it possible to form the mask having a minute pattern (shape) easily and surely without the need of a large-scale equipment.

In the method of forming an oxide film according to the present invention, it is preferable that the method further includes the step of subjecting the surface of the base material to surface treatment therefor after the mask forming step.

By selecting at least one of treatment of eliminating a natural oxide film existing on the surface of the base material, treatment of deteriorating a natural oxide film and treatment of halogenating a natural oxide film, the surface of the base material becomes a state to easily react the alcohol. Therefore, the inorganic material can react with the alcohol surely.

In the method of forming an oxide film according to the present invention, it is preferable that the method further includes the step of subjecting the surface of the base material to surface treatment therefor prior to the process liquid supplying step.

By selecting at least one of treatment of eliminating a natural oxide film existing on the surface of the base material, treatment of deteriorating a natural oxide film and treatment of halogenating a natural oxide film, the surface of the base material becomes a state to easily react the alcohol. Therefore, the inorganic material can react with the alcohol surely.

In the method of forming an oxide film according to the present invention, it is preferable that in the process liquid eliminating step the process liquid remaining in the liquid film is eliminated at room temperature or while heating the base material.

Thus, it is possible to appropriately control quality of the oxide film (including accuracy of the oxide film, impurity concentration therein), a process time and the like at room temperature or while heating the base material. Further, by eliminating the process liquid while heating, it is possible to dry the liquid film more efficiently, and this contributes to shorten the time for forming the oxide film. Moreover, it is possible to convert intermediate products existing in the liquid film into the oxide, and this makes it possible to reduce the impurity concentration in the obtained oxide film.

In the method of forming an oxide film according to the present invention, it is preferable that the inorganic material includes at least one of metal and semiconductor.

According to the present invention, it is possible to produce the oxide easily and surely without being limited any one of some particular types of inorganic materials.

In the method of forming an oxide film according to the present invention, it is preferable that post-treatment for the oxide film is carried out at least one times.

In the method of forming an oxide film according to the present invention, it is preferable that the post-treatment includes a sealing process and a coloring process.

By subjecting the oxide film to the sealing process, it is possible to improve resistivity of the oxide film (in particular, chemical resistance). Further, by subjecting the oxide film to the coloring process, it is possible to improve its sensuousness in the case where the base material is a part or the whole of component in which sensuousness is required such as an ornament, for example.

In another aspect of the present invention, the present invention is directed to an oxide film. The oxide film of the present invention is formed using the method described above.

This makes it possible to obtain the oxide film easily.

In yet another aspect of the present invention, the present invention is directed to a component. The component of the present invention includes the oxide film described above.

The component of the present invention may be applied to various electronic devices such as a thin-film diode (TFD) and a surface acoustic wave (SAW) device, a component for an automobile or the like, a building component, a chassis for an electrical apparatus (for example, a chassis for a digital still camera), a material for forming a case of stationery, for example.

In particular, it is preferable that the oxide film is subjected to post-treatment in the case where the component of the present invention is applied to a component for an automobile or the like, a building component, a chassis for an electrical apparatus (for example, a chassis for a digital still camera), material for forming a case of stationery.

In the component of the present invention, it is preferable that the component includes an electronic device.

According to the method of forming an oxide film of the present invention, since it is possible to form the oxide film on the contact region between the process liquid and the base material selectively, it is possible to form the oxide film having a minute pattern by supplying the process liquid to a minute region. Therefore, the method of forming an oxide film of the present invention is suitable in particular for application to the case where the oxide film provided in any one of various electronic devices is formed. Namely, it is preferable that the component is applied to an electronic device, in particular.

In yet another aspect of the present invention, the present invention is directed to an electronic apparatus. The electronic apparatus of the present invention includes the component described above.

BRIEF DESCRIPTION OF THE DRAWINGS

The foregoing and other objects, features and advantages of the present invention will become more readily apparent from the following detailed description of preferred embodiments of the present invention which proceeds with reference to the accompanying drawings.

DETAILED DESCRIPTION OF THE INVENTION

Preferred embodiments of a method of forming an oxide film, an oxide film, a component and an electronic apparatus will now be described in detail with reference to the appending drawings.

First Embodiment

Figure 1:
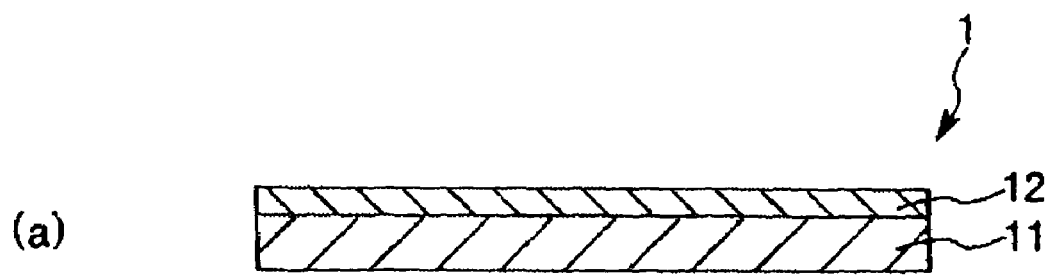
FIG. 1 is a drawing for explaining a method of forming an oxide film in a first embodiment according to the present invention.
Figure 1:
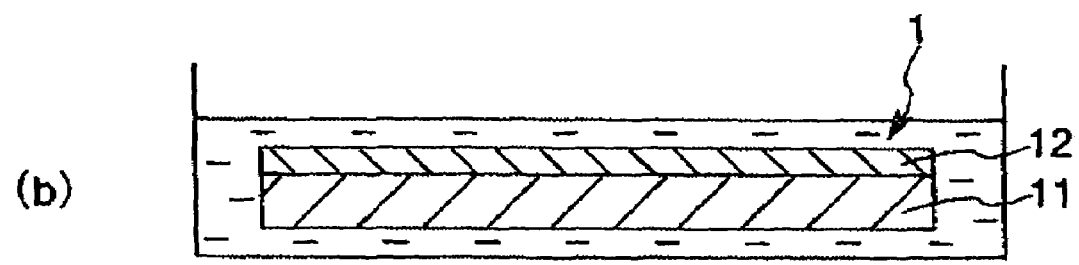
Figure 1:
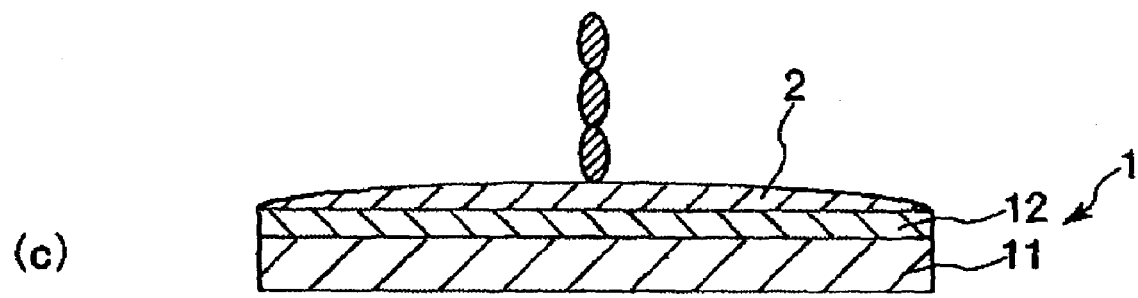
Figure 1:
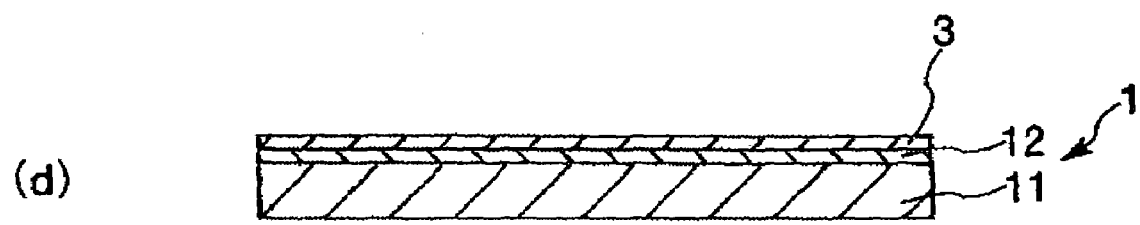

First, an explanation will now be given for a first embodiment of the method of forming an oxide film according to the present invention. FIG. 1 is a drawing for explaining a method of forming an oxide film in a first embodiment according to the present invention.

The method of forming an oxide film in the first embodiment includes <1A> a step of preparing a processed member, <2A> a step for surface treatment, <3A> a step of forming a liquid film, <4A> a step of producing an oxide film, <5A> a step for drying, and <6A> a step for post-treatment. Hereinafter, each of the steps will be described.

<1A> Step of Preparing Processed Member

First, a processed member 1 on which an oxide film 3 is to be formed is prepared. The processed member 1 shown in FIG. 1(*a*) includes a substrate 11 and a surface layer (covering layer) 12 formed on the surface of the substrate 11. The surface layer 12 is constituted from an inorganic material. Namely, in the present embodiment, the surface layer 12 constitutes a base material.

As a constituent material of the base material 11, for example, quartz glass, silicon dioxide, silicon nitride, polyethylene terephthalate, polyimide, silicon, crystal and the like may be mentioned. Further, as a constituent material of the surface layer 12, for example, various metals such as Al, Ta, Ti, Mn, Sb, Fe, Cu, W, Mo, Y, Pb, Sc, Nb, and metal alloy including at least one of these metals, and various semiconductors including elemental semiconductors such as Si, Ge, and compound semiconductors including at least one of Si and Ge and at least one of Ga, In, Al, As, Sb, Zn, Se, Pb, P and N may be mentioned. According to the present invention, it is possible to produce the oxide easily and surely without selecting kinds of inorganic materials.

Further, as a method of forming the surface layer 12, for example, a liquid phase growth method (a wet plating method) such as an electrolytic plating method, a dipping plating method (dipping) and an electroless plating method, a physical vapor deposition method such as a vacuum evaporation method, a sputtering method and an ion plating method, and a chemical vapor deposition (CVD) method such as a thermal CVD method, a plasma CVD method, a laser CVD method and an MOCVD method, and joint of a sheet member and the like may be mentioned.

In this regard, the processed member 1 is not limited to the structure shown in FIG. 1, and the whole of the processed member 1 may be constituted from the inorganic material described above. In this case, the entire processed member 1 constitutes the base material.

<2A> Step for Surface Treatment

Next, the surface of the processed member 1 (that is, surface layer 12) is subjected to surface treatment. As the method for this surface treatment, for example, (A) a method of bringing the surface of the processed member 1 into contact with an alkali solution or an acid solution, (B) a method of bringing the surface of the processed member 1 into contact with an acid gas, (c) a method of applying moisture onto the surface of the processed member 1, (D) a method of bringing the surface of the processed member 1 into contact with plasma, and the like may be mentioned.

(A) Method of Bringing Surface of Processed Member 1 into Contact with Alkali Solution or Acid Solution As shown in FIG. 1(*b*), this method is suitably carried out using a method of dipping the processed member 1 into an alkali solution or an acid solution. As an alkali solution to be utilized, for example, a sodium hydroxide solution, a potassium hydroxide solution, and the like may be mentioned. On the other hand, as an acid solution to be utilized, for example, a hydrogen chloride (HCl) solution (hydrochloric acid), a sulfuric acid ($H_2SO_4$) solution, a hydrogen fluoride (HF) solution (hydrofluoric acid), and the like may be mentioned.

Further, it is preferable that the alkali concentration in the alkali solution is in the range of about 1 to 20% by weight, and it is preferable that the acid concentration is in the range of about 1 to 50% by weight. Moreover, it is preferable that the temperature of each solution is in the range of about 15 to 35° C., and it is preferable that the dipping time for the processed member 1 into each solution is in the range of about 5 to 120 seconds. In this case, the processed member 1 is washed with water by a predetermined period (for example, about 1 to 10 minutes) after the end of the dipping process, and the processed member 1 is then dried naturally or by blowing an inert gas (for example, nitrogen gas) thereto. According to such a method, it is possible to eliminate a natural oxide film formed on the surface of the processed member 1 (surface layer 12).

(B) Method of Bringing Surface of Processed Member 1 into Contact with Acid Gas This method is suitably carried out using a method of exposing the processed member 1 to vapor of the acid solution described above, the atmosphere of a hydrogen chloride gas, or the atmosphere of a hydrogen fluoride gas, for example. According to such a method, it is possible to apply damage to the natural oxide film formed on the surface of the processed member 1 (surface layer 12) (for example, deteriorate the natural oxide film), or to halogenate (for example, chloridize and fluoridate) the natural oxide film.

(C) Method of Applying Moisture onto Surface of Processed Member 1

This method is suitably carried out using a method of dipping the processed member 1 into pure water, or exposing the processed member 1 to the atmosphere of water vapor, for example. In this regard, the processed member 1 is then dried by blowing an inert gas to the processed member 1. According to such a method, it is possible to improve reactivity of the alcohol with the natural oxide film formed on the surface of the processed member 1 (surface layer 12).

(D) Method of Bringing Surface of Processed Member 1 into Contact with Plasma This method is suitably carried out using a method of radiating plasma onto the surface of the processed member 1 under the atmospheric pressure, for example. It is preferable that a gas including an inert gas such as He is used as an introduced gas. For example, pure He, a mixed gas of He and $O_2$, a mixed gas of He, $O_2$ and carbon fluorine, and the like may be mentioned.

It is preferable that in the volume of flowing of the introduced gas the volume of pure He is in the range of about 1 to 30 liter per minute in the case of using pure He. Further, it is preferable that in the volume of flowing of the introduced gas the volumes of He and $O_2$ are respectively in the range of about 1 to 30 liter per minute and in the range of about 10 to 500 sccm in the case of using a mixed gas of He and $O_2$. Moreover, it is preferable that in the volume of flowing of the introduced gas the volumes of He, $O_2$ and carbon fluorine are respectively in the range of about 1 to 30 liter per minute, in the range of about 10 to 500 sccm and in the range of about 10 to 500 sccm in the case of using a mixed gas of He, $O_2$ and carbon fluorine.

Further, it is preferable that HF output power (RF power) is in the range of about 100 to 1000 W, and that distance (gap) between an electrode and the processed member 1 is in the range of about 0.1 to 3 mm. Moreover, in the case where the electrode and the processed member 1 are mutually moved, it is preferable that the mutual moving velocity (transporting velocity) is in the range of about 0.1 to 10 mm per second. According to such a method, it is possible to apply damage to the natural oxide film formed on the surface of the processed member 1 (surface layer 12) (for example, deteriorate the natural oxide film).

In this regard, in the surface treatment described above, any two or more methods among the methods A to D may be used together. By subjecting the processed member 1 to the surface treatment described above, that is, by carrying out at least one of the treatment of eliminating the natural oxide film existing on the surface of the processed member 1, the treatment of deteriorating the natural oxide film and the treatment of halogenating the natural oxide film, the surface of the processed member 1 becomes a state to easily react the alcohol. Therefore, the inorganic material can react with the alcohol more surely.

In this regard, the step <2A> may be omitted if necessary. For example, in the case where the processed member 1 has the configuration in which the surface layer 12 is formed on the surface of the substrate 11 as the processed member 1 in the present embodiment, it is possible to omit the step <2A> by shifting the subsequent step <3A> or keeping the processed member 1 in the atmosphere of an inert gas (for example, nitrogen gas) shortly after the surface layer 12 is formed on the surface of the substrate 11.

<3A> Step of Forming Liquid Film

Next, by supplying a process liquid containing an alcohol onto the surface of the processed member 1 (surface layer 12), a liquid film 2 of the process liquid is formed thereon.

As a method of supplying the process liquid onto the surface of the processed member 1, for example, a method of exposing the processed member 1 to vapor of the process liquid (that is, the gaseous process liquid) or the like may be mentioned in addition to a method of applying (or dropping) the process liquid onto the surface of the processed member 1 as shown in FIG. 1(c). According to such a method, it is possible to form the liquid film 2 on the surface of the processed member 1 easily and surely.

It is possible to use any one of a monohydric alcohol and a polyhydric alcohol independently or combination of any two or more of them as the alcohol described above. In particular, it is preferable to use at least one of a monohydric alcohol, a dihydric alcohol and a trihydric alcohol. These alcohols are compounds each having relatively high reactivity with the inorganic material.

Further, although the number of carbon atoms in the alcohol molecule to be required somewhat changes in accordance with the number of hydroxyl radicals, it is preferable that the number of carbon atoms in one alcohol molecule of the alcohol is in the range of one to six, and more preferably it is in the range of one to four. These alcohols are compounds each having high reactivity with the inorganic material in particular.

As concrete examples of such an alcohol, for example, a monohydric alcohol such as methanol, ethanol, propanol and butanol, a dihydric alcohol such as ethylene glycol, and a trihydric alcohol such as glycerin may be mentioned. Furthermore, it is preferable that at least a part of hydrogen atoms included in the alcohol molecule other than a hydroxyl radical therein are replaced with fluorine atoms as trifluoroethanol, for example. Such a fluoroalcohol is a compound having extremely high reactivity with the inorganic material.

Further, it is preferable that the concentration (rate of content) of the alcohol in the process liquid is 95% by weight or more, and more preferably it is 99% by weight or more. In the case where the concentration of the alcohol in the process liquid is too low, it is likely that it is difficult to produce the oxide efficiently at the next step <4A> depending on the kind of alcohol, processing temperature or the like. Moreover, although the process liquid may be supplied onto the surface of the processed member 1 at room temperature, it is preferable that the supply of the process liquid is carried out while heating the processed member 1 (surface layer 12). Thus, the reaction of the alcohol with the inorganic material at the next step <4A> can be carried out more smoothly and more surely, and this makes it possible to shorten time for forming the oxide film 3. As a method of heating the processed member 1, heating by a heater, irradiation of infrared rays may be mentioned. One of them may be utilized, and alternatively combination of two or more of them may be utilized.

<4A> Step of Producing Oxide Film

Next, the oxide of the inorganic material is produced through the reaction of the inorganic material with the alcohol in the liquid film 2. In the liquid film 2, the oxide of the inorganic material may be produced through the following types of reactions. In this case, a process (reaction path) in which $Al_2O_3$ that is an oxide of an inorganic material is produced through the reactions of a monohydric alcohol (R—OH) with Al that is an inorganic material is shown as one example. In this regard, the reaction path is not limited to the example as follows.

$$2Al + 6R\text{—}OH \rightarrow 2Al(O\text{—}R)_3 + 3H_2 \quad (1)$$

$$2Al(O\text{—}R)_3 + 6H_2 \rightarrow 2Al(OH)_3 + 6R\text{—}H \quad (2)$$

$$2Al(OH)_3 \rightarrow Al_2O_3 \cdot H_2O + 2H_2O \quad (3)$$

The step <4A> may be carried out at room temperature, or it may be carried out while heating the processed member 1 in accordance with the kind of alcohol, for example. In the present embodiment, it is preferable that the step <4A> is carried out while prevent the process liquid from being evaporated. Further, the time required for carrying out the step <4A> (that is, the time required for reaction of the inorganic material with the alcohol) somewhat changes in accordance with the kind of organic material, the kind of alcohol, the quality or thickness of the oxide film to be obtained, conditions for processing the step <2A> or the like. Therefore, the time required for carrying out the step <4A> is not particularly limited, but it is preferable that it is in the range of about one minute to 100 hours, and more preferably it is in the range of about 10 minutes to 20 hours. In the case where the time described above is too short under the lower limit, it is likely that it is impossible to obtain an oxide film having a sufficient film thickness. On the other hand, even though the time is too long over the upper limit, the increased effect cannot be expected.

In this regard, the next step <5A> can be carried out at the same time as the step <4A>. In other words, by appropriately setting, for example, heating temperature of the processed member 1, pressure of the atmosphere and the like, it is possible to produce the oxide of the inorganic material in the liquid film 2. In addition, it is possible to adjust drying rate of the liquid film 2 so that the liquid film 2 is dried gradually (that is, the process liquid remaining in the liquid film 2 is eliminated slowly).

Further, the step <4A> may not necessarily be separated from the step <3A>. In other words, the production of the oxide may occur at the step <3A>. It is possible to select whether or not the production of the oxide occurs at the step <3A> by appropriately setting the conditions for processing the step <3A>.

<5A> Step for Drying (Step of Eliminating Process Liquid)

Next, the liquid film 2 is made to be dried. By eliminating the process liquid remaining in the liquid film 2 (that is, unreacted alcohol mainly), the oxide is solidified, and then, as shown in FIG. 1(d), an oxide film 3 constituted from the oxide as a main material is obtained.

It is preferable to dry the liquid film 2 at room temperature or while heating the processed member 1 (surface layer 12). This makes it possible to carry out the drying of the liquid film 2 more efficiently, and it contributes to shortening of the time for forming the oxide film 3. Further, it is possible to change intermediate products existing in the liquid film 2 (in the example described above, Al(O—R)$_3$, Al(OH)$_3$) to the oxide, and this makes it possible to further reduce the concentration of any impurity in the obtained oxide film 3.

In this regard, the liquid film 2 may be dried by using a method of spraying an inert gas or the like thereto in combination with a method of decompressing the atmosphere, for example. Further, the thickness of the obtained oxide film 3 can be adjusted by appropriately setting the heating temperature for the processed member 1 at the step <3A>, the amount of process liquid to be supplied, the concentration of the alcohol in the process liquid, the time required for the step <4A>, for example.

<6A> Step for Post-treatment

Next, the oxide film 3 is subjected to post-treatment at least once. In this regard, the step <6A> is applied to the processed member 1 (that is, the oxide film 3) in the case where the processed member 1 in which the oxide film 3 is formed on the surface thereof (which is a component of the present invention) is a component (or member) mainly used as a material for forming a housing for an electric apparatus, a building member, a case of stationery or the like. As for the post-treatment, for example, a sealing process for sealing holes formed on the oxide film 3, a coloring process for coloring the oxide film 3, a polishing process for polishing the surface of the oxide film 3, and the like may be mentioned. Any one of these processes may be carried out, and alternatively combination of two or more of them may be utilized. It is preferable that the oxide film 3 is subjected to at least one of the sealing process and the coloring process among them, in particular.

By subjecting the oxide film 3 to the sealing process, it is possible to improve resistivity of the oxide film 3 (in particular, chemical resistance). Further, by subjecting the oxide film 3 to the coloring process, it is possible to improve its sensuousness in the case where the base material is a part or the whole of component in which sensuousness is required such as an ornament, for example. In this regard, as such a sealing process, for example, a sealing process by hot water, a sealing process by vapor, a sealing process by metallic salt, and the like may be mentioned. Further, as such a coloring process, for example, electrolytic coloring, electrolytic color, natural color, and the like may be mentioned.

Second Embodiment

Figure 2:
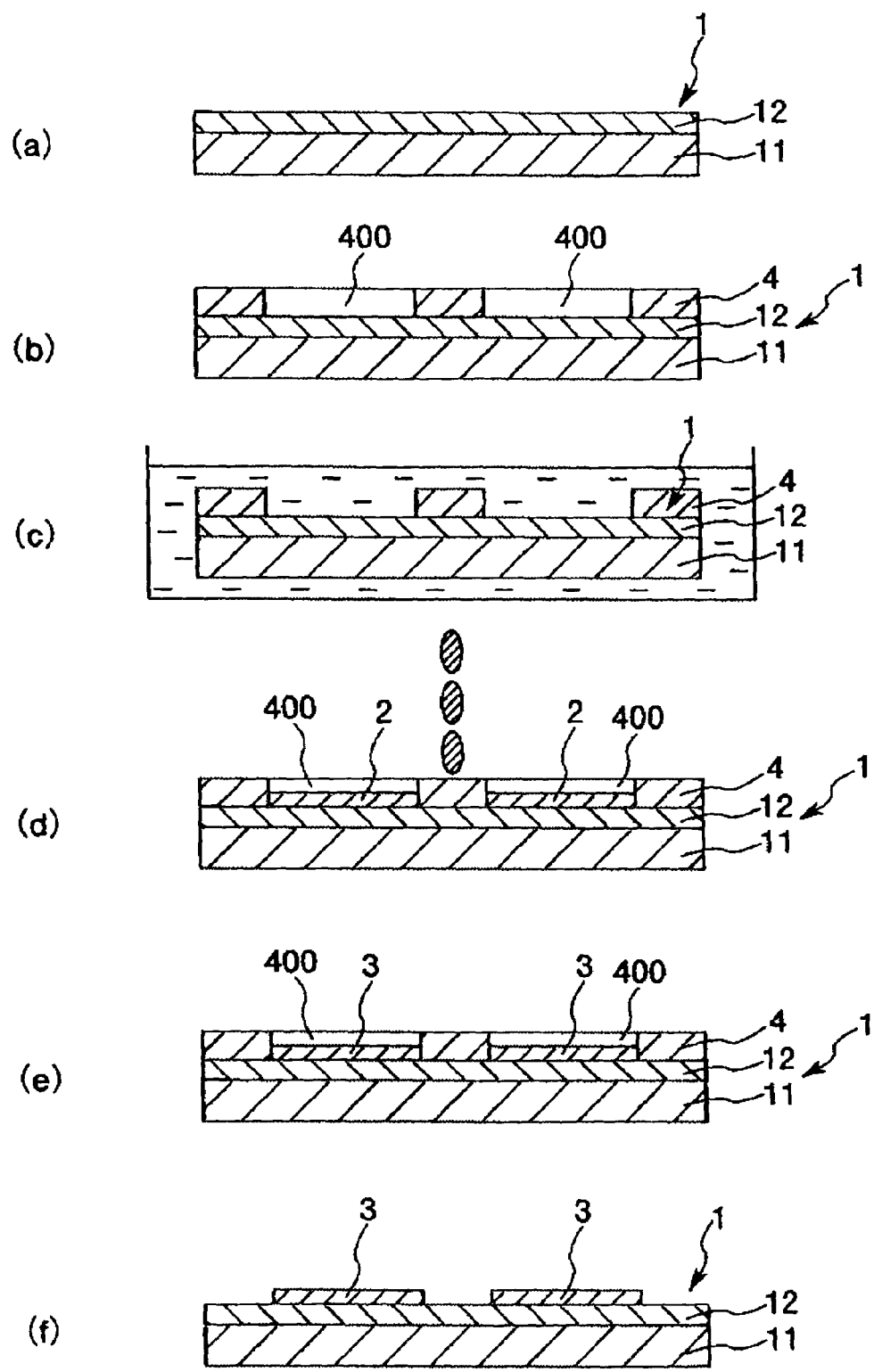
FIG. 2 is a drawing for explaining a method of forming an oxide film in a second embodiment according to the present invention.

Next, an explanation will now be given for a second embodiment of the method of forming an oxide film according to the present invention. FIG. 2 is a drawing for explaining a method of forming an oxide film in a second embodiment according to the present invention.

Hereinafter, an explanation will be given for the method of forming an oxide film of the second embodiment with reference to FIG. 2; however, differences between the first embodiment described above and the second embodiment are chiefly described, and the description of the similar portions is omitted.

The method of forming an oxide film in the second embodiment is similar to the method of forming an oxide film in the first embodiment except that a step of forming a mask is added prior to the step of forming a liquid film. Namely, the method in the second embodiment includes <1B> a step of preparing a processed member, <2B> a step of forming a mask, <3B> a step for surface treatment, <4B> a step of forming a liquid film, <5B> a step of producing an oxide film, <6B> a step for drying, <7B> a step of eliminating the mask, and <8B> a step for post-treatment. Hereinafter, each of the steps will be described.

<1B> Step of Preparing Processed Member (see FIG. 2(a))

The step similar to the step <1A> described above is carried out.

<2B> Step of Forming Mask (see FIG. 2(b))

Next, a mask 4 is formed on the surface of the processed member 1. The mask 4 has a plurality of openings 400 corresponding to the shape of the oxide film 3 to be formed. This makes it possible to form the oxide film 3 having a predetermined shape. In other words, patterning of the oxide film 3 can be carried out.

The mask 4 can be formed by means of, for example, a photolithography method; a liquid phase growth method (a wet plating method) such as an electrolytic plating method, a dipping plating method (dipping) and an electroless plating method; a physical vapor deposition method such as a vacuum evaporation method, a sputtering method and an ion plating method; and a chemical vapor deposition (CVD) method such as a thermal CVD method, a plasma CVD method, a laser CVD method and an MOCVD method, or the like. Among these, it is preferable to utilize the photolithography method for forming the mask 4. In other words, it is preferable that the mask 4 is a resist layer constituted from a resist material as a main material. According to the photolithography method, it is possible to form the mask 4 having a minute pattern (shape) easily and surely without the need for a large-scale equipment.

In this case, it is possible to form the mask 4 by exposing and developing the resist material after applying the resist material onto the surface of the processed member 1 (surface layer 12). The resist material to be utilized may be either a negative type resist material in which a portion where light is emitted is hardened or a positive type resist material in which a portion where light is emitted is melted. As a negative type resist material, for example, poly(vinyl cinnamate), polyvinyl azidobenzoyl, acrylamide, polyimide, ones including novolac resin as a main component (for example, chemical amplification type resin such as novolac resin containing an acid-forming agent and/or a cross-linking agent), and the like may be mentioned. On the other hand, as a positive type resist material, for example, o-quinone azidonovolac resin, polyimide, and the like may be mentioned.

Further, as light to be emitted, for example, ultraviolet rays (such as g ray, i ray), electron beam, and the like may be mentioned. A method of applying the resist material onto the surface of the processed member 1 is not particularly limited. It is preferable to use various application methods (coating methods) such as a dip coat method, a spin coat method, a slit coat method, a cap coat method, a dispenser method, a spray coat method, a roll coat method, a screen printing method, an ink jet printing method, and an LSMCD method, for example.

In this regard, by applying a negative type resist material onto the surface of the processed material 1 by means of various printing methods so that the applied resist material has a shape corresponding to the mask 4 to be formed, it is possible to omit the developing process.

Further, in the case of the mask 4 constituted from the resist material as a main material, it is preferable that at least the surface of the mask 4 is hardened by subjecting the mask 4 to a hardening process if needed. By hardening the surface of the mask 4, it is possible to improve heat resistance and chemical resistance of the mask 4, and this makes it possible to prevent the mask 4 from deteriorating at subsequent steps appropriately. As a result, it is possible to form the oxide film 3 having a desired shape with high dimensional accuracy. As a method of hardening the surface of the mask 4, for example, heating by a heater, irradiation of ultraviolet rays, irradiation of infrared rays, irradiation of electron beam, application of ultrasonic waves, application of high frequency waves, and the like may be mentioned. Any one of them or combination of any two or more of them may be utilized.

<3B> Step for Surface Treatment (see FIG. 2(*c*))

The step similar to the step <2A> described above is carried out. Further, if necessary, the surface treatment for the processed member 1 may be carried out prior to the step <2B>, and it may be carried out both prior to and after the step <2B>.

<4B> Step of Forming Liquid Film (see FIG. 2(*d*))

The step similar to the step <3A> described above is carried out.

<5B> Step of Producing Oxide Film

The step similar to the step <4A> described above is carried out.

<6B> Step for Drying (see FIG. 2(*e*))

The step similar to the step <5A> described above is carried out.

<7B> Step of Eliminating Mask (see FIG. 2(*f*))

Next, the mask 4 is eliminated from the processed member 1. Thus, the oxide film 3 having a predetermined shape is obtained. A method of eliminating the mask 4 may be appropriately selected in accordance with the kind of mask 4. The elimination of the mask 4 can be carried out by means of, for example, ashing by oxygen plasma or ozone under the atmospheric pressure or reduced pressure, irradiation of ultraviolet rays, irradiation of various lasers such as an Ne—He laser, an Ar laser, a $CO_2$ laser, a ruby laser, a semiconductor laser, a YAG laser, a glass laser, a $YVO_4$ laser, an excimer laser and the like, contact with a solvent that can melt or dissolve the mask 4 (for example, dipping), or the like. For example, in the case of the mask 4 constituted from the resist material as a main material, it is preferable that the mask 4 is eliminated by means of an oxygen plasma process under the atmospheric pressure or under a vacuum (an ashing process), a releasing process by a resist releasing agent, a resolving process by an organic solvent (such as concentrated sulfuric acid) or ozone water.

<8B> Step for Post-treatment

The step similar to the step <6A> described above is carried out.

As described above, according to the method of forming an oxide film of the present invention, it is possible to selectively form the oxide film 3 on contact portions between the process liquid and the processed member 1. For this reason, even in the case where patterns for forming the oxide film 3 are discontinuous, electrical wiring to connect the patterns each other is not required in contrast with an anodic oxidation method, and thus it is easy to form the desired oxide film 3. Further, according to the method of forming an oxide film of the present invention, since the processed member 1 is not exposed to high temperature at any step, the range of options for a processible processed member 1 can be expanded.

The method of forming an oxide film of the present invention described above can be applied to the formation of an oxide film included in various electronic devices such as a thin-film diode (TFD) and a surface acoustic wave (SAW) device, a component for an automobile or the like, a building component, a chassis for an electrical apparatus (for example, a chassis for a digital still camera), a material for forming a case of stationery, for example. Namely, it is preferable that the component of the present invention is applied to these components.

Further, as mentioned above, according to the present invention, since it is possible to selectively form the oxide film 3 on contact portions between the process liquid and the processed member 1, it is possible to form the oxide film 3 having minute patterns by applying the process liquid to a minute region. Therefore, the method of forming an oxide film of the present invention is suitable to apply the case of forming the oxide film 3 with which any of various electronic devices among the components described above is provided, in particular.

<Component>

Figure 3:
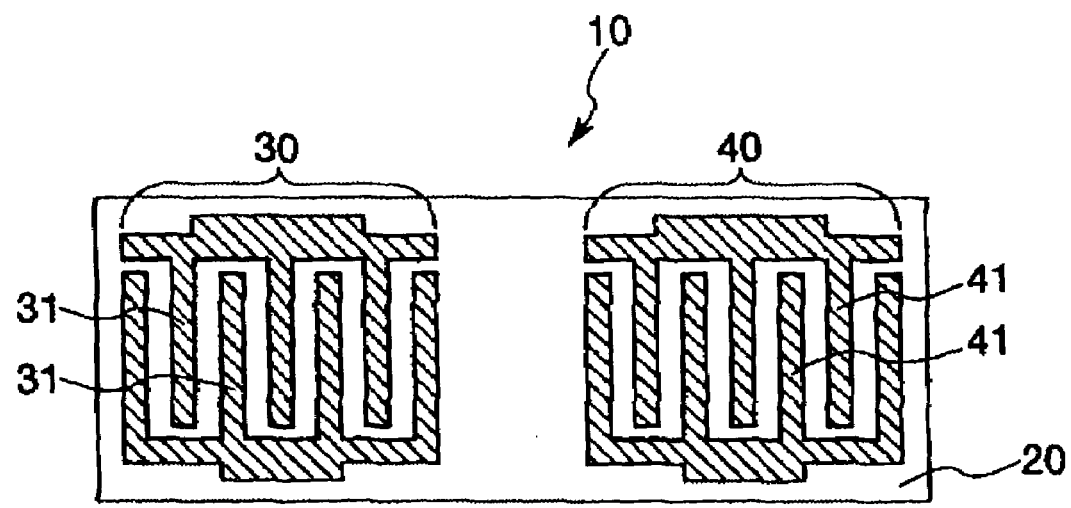
FIG. 3 is a plan view which shows an embodiment of a surface acoustic device.
Figure 4:
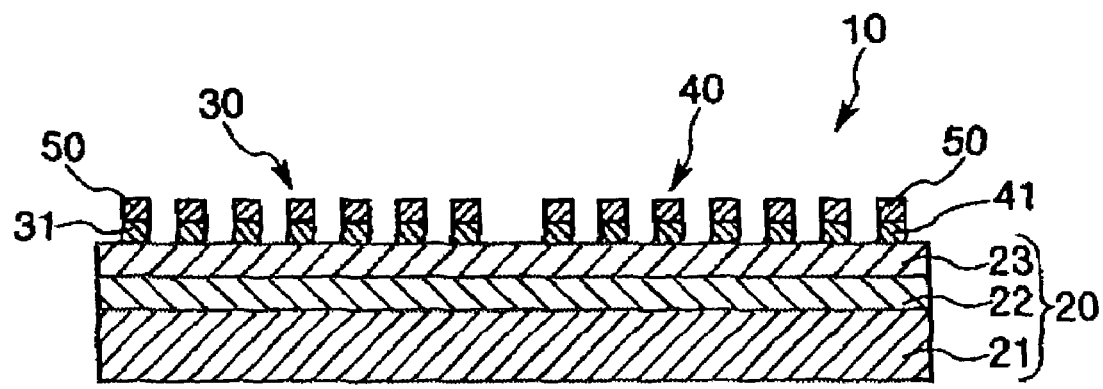
FIG. 4 is a vertical cross-sectional view of the surface acoustic device shown in FIG. 3.

Next, a surface acoustic wave (SAW) device will now be described as an example of an electronic device (a component of the present invention) provided with the oxide film 3 of the present invention. FIG. 3 is a plan view which shows an embodiment of a surface acoustic device. FIG. 4 is a vertical cross-sectional view of the surface acoustic device shown in FIG. 3. Now, in following explanations using FIG. 4, for convenience of explanation, an upper side and lower side in FIG. 4 are referred to as "upper" and "lower," respectively.

A surface acoustic wave device 10 shown in FIGS. 3 and 4 is a surface acoustic wave device having a transversal type structure. The surface acoustic wave device 10 includes a substrate 20 having piezoelectricity at least in the vicinity of the surface thereof, an IDT for input 30 and an IDT for output 40 both provided on the substrate 20, and insulation protective films 50 provided on the upper surface of each of the IDTs 30 and 40.

The substrate 20 is constituted by laminating a foundation layer 22 and a piezoelectric layer 23 on a base 21 in turn. As a constituent material for the base 21, for example, various semiconductor materials such as Si, GaSi, SiGe, GaAs, STC, and InP, various glass materials, various ceramic materials, various resin materials such as polyimide, and polycarbonate may be mentioned. The average thickness of the base 21 is not particularly limited, and it is preferable that it is in the range of about 0.05 to 1 mm. More preferably, it is in the range of about 0.1 to 0.8 mm. Further, the base 21 may be constituted from not only a single layer but also a laminated element having a plurality of layers. In the case of the laminated element, each of the layers may be constituted by arbitrarily combining any of the materials described above.

The foundation layer 22 has a function of setting characteristics (or conditions) of the surface acoustic wave to be exited in the piezoelectric layer 23. The characteristics include an oscillating frequency, amplitude, a propagation velocity, for example. By providing the foundation layer 22 and appropriately setting a constituent material thereof, it is possible to set desired characteristics of the surface acoustic wave. It is preferable that the foundation layer 22 is constituted from, for example, at least one of diamond, silicon, sapphire, glass, crystal, lithium tantalate, potassium niobate and lithium niobate as a main material. In particular, one constituted from at least one of diamond, sapphire, lithium tantalate and potassium niobate as a main material is suitable. This makes it possible to contribute higher frequency of the surface acoustic wave required to apply the surface acoustic wave to high speed communication field such as a wireless LAN and optical communication.

The average thickness of the foundation layer 22 is not particularly limited. It is preferable that it is in the range of about 1 to 20 μm, and more preferably it is in the range of about 3 to 5 μm. Further, the foundation layer 22 may be constituted from not only a single layer but also a laminated element having a plurality of layers. In this regard, since the foundation layer 22 is provided if needed, it is possible to omit the foundation layer 22.

The piezoelectric layer 23 has a function as a transmission medium of the surface acoustic wave. It is preferable that the piezoelectric layer 23 is constituted from, for example, at least one of zinc oxide, aluminum nitride, lithium tantalate, potassium niobate and lithium niobate as a main material. By constituting the piezoelectric layer 23 from such a material, it is possible to obtain the surface acoustic wave device 10 having high frequency and excellent temperature characteristics. Further, the average thickness of the piezoelectric layer 23 is not particularly limited. It is preferable that it is in the range of about 0.01 to 5 μm, and more preferably it is in the range of about 0.1 to 2 μm. In this regard, a substrate having a single layer structure can be utilized as the substrate 20 in place of the substrate having a multiple layer structure.

The IDT (input electrode) 30 has a function of exciting a surface acoustic wave in the piezoelectric layer 23 by applying voltage to the piezoelectric layer 23, while the IDT (output electrode) 40 has a function of detecting the surface acoustic wave that is transmitted in the piezoelectric layer 23 and converting the surface acoustic wave to output an electric signal to the outside thereof. When driving voltage is inputted into the IDT 30, a surface acoustic wave is excited in the piezoelectric layer 23, and then an electric signal having a specific frequency band by a filtering function is outputted from the IDT 40.

The IDTs 30 and 40 are constructed from a pair of bipectinate electrodes having a plurality of electrode fingers 31 and 41, respectively. By adjusting the width or thickness of each of the electrode fingers 31, 41, interval between the adjacent electrode fingers 31, 41, or the like, it is possible to set desired characteristics of the oscillating frequency of the surface acoustic wave. As a constituent material of each of the IDTs (base material) 30 and 40, for example, Al, Cu, W, Mo, Ti, Au, Y, Pb and Sc, and an alloy including at least one kind of these elements may be mentioned. One kind of them or a combination of two or more kinds of these elements can be utilized.

The insulation protective film 50 has a function of preventing foreign objects from adhering on the surface of each of the IDTs 30 and 40, thereby preventing a short circuit between the IDTs 30 and 40 from occurring. The insulation protective film 50 is formed so as to have a shape and an area substantially equal to those of the IDTs (bipectinate electrodes) 30, 40 thereon. In the present embodiment, the insulation protective film 50 is constituted from the oxide film 3 of the present invention.

Such a structure makes a material change from the insulation protective film 50 to the substrate 20 on the route on which the surface acoustic wave transmits be eliminated. Practically, material changes on the route include only a change from the electrode fingers 31, 41 to the substrate 20. Therefore, it is possible to suppress reflection of the surface acoustic wave due to the material change and energy loss due to the reflection, and this makes it possible to obtain high input-output efficiency. Further, the average thickness of insulation protective film 50 is not particularly limited. It is preferable that it is in the range of about 10 to 1000 nm, and more preferably it is in the range of about 30 to 300 nm. By restricting the thickness of the insulation protective film 50 within the above range, the surface acoustic wave device 10 can achieve a sufficient insulation performance while preventing (or suppressing) the oscillating frequency of the surface acoustic wave from lowering due to increase of the mass thereof.

Figure 5:
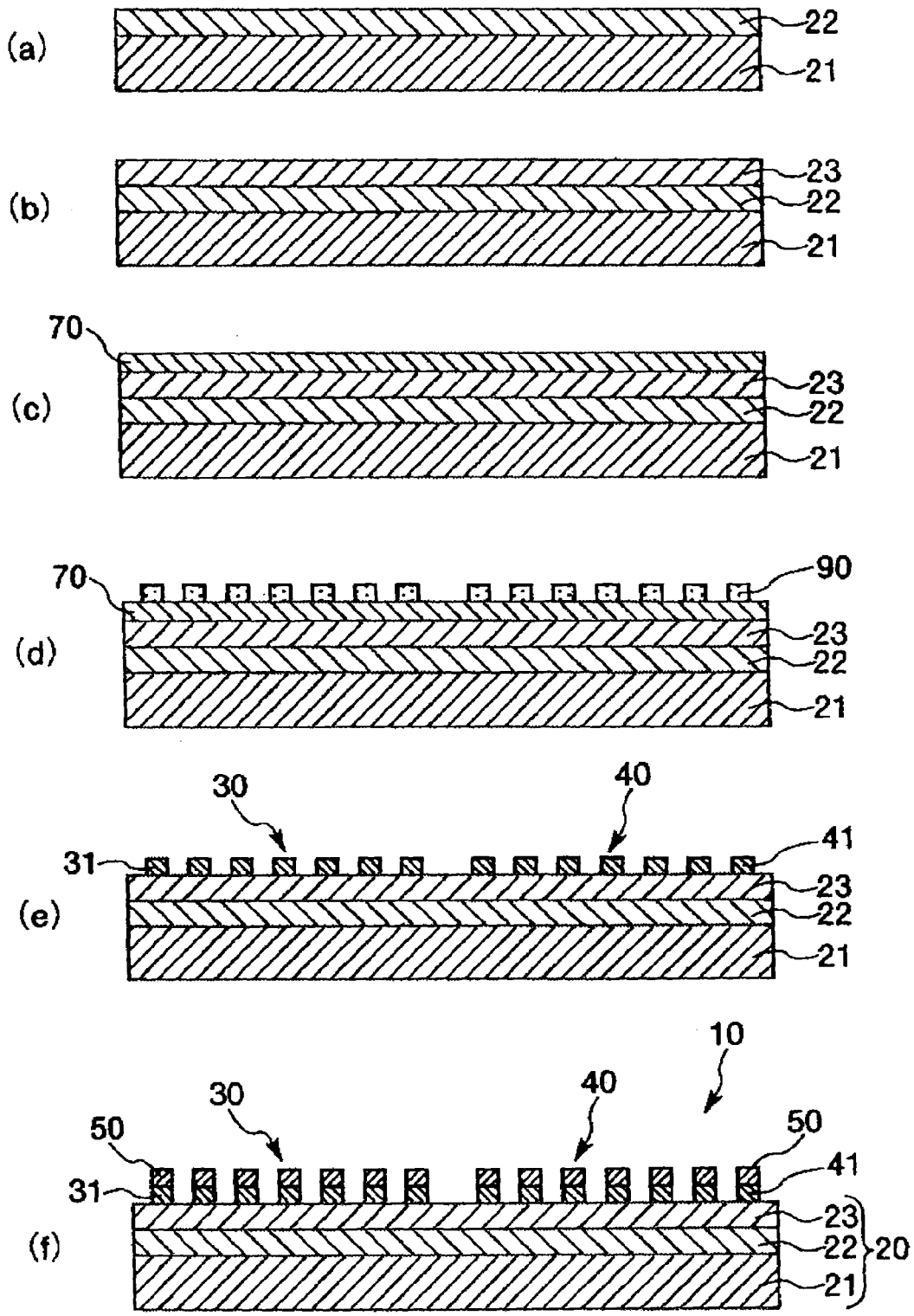
FIG. 5 is a drawing (cross-sectional view) for explaining a method of manufacturing the surface acoustic wave device shown in FIGS. 3 and 4.

It is possible to manufacture the surface acoustic wave device described above as follows. FIG. 5 is a drawing (cross-sectional view) for explaining a method of manufacturing the surface acoustic wave device shown in FIGS. 3 and 4.

First, as shown in FIGS. 5(*a*) and 5(*b*), a foundation layer 22 and a piezoelectric layer 23 are in turn formed on the base 21 by means of a vacuum evaporation method, for example.

Next, as shown in FIG. 5(*c*), a conducting material layer 70 is formed on the piezoelectric layer 23 by means of a vacuum evaporation method, for example.

Next, as shown in FIG. 5(*d*), a mask 90 having a shape that corresponds to IDTs 30, 40 is formed on the conducting material layer 70.

Next, by eliminating the mask 90 after subjecting the conducting material layer 70 to an etching process using the mask 90, the IDTs 30, 40 are obtained as shown in FIG. 5(*e*).

Next, as shown in FIG. 5(*f*), an insulation protective film 50 is selectively formed on the IDTs 30, 40 by means of the method of forming an oxide film of the present invention. Through the steps described above, a surface acoustic wave device 10 is manufactured.

In this regard, by forming an insulative material layer on the conducting material layer 70 by means of the method of forming an oxide film of the present invention and by subjecting such a laminated element to an etching process using the mask, the insulation protective film 50 and the IDTs 30, 40 may be formed at the same time. Such a surface acoustic wave device (component of the present invention) 10 can be applied to various electronic apparatus, and such an electronic apparatus thus obtained has high reliability.

<Electronic Apparatus>

Hereinafter, an electronic apparatus provided with the surface acoustic wave device 10 will now be described in detail on the basis of embodiments shown in FIGS. 6 to 8.

Figure 6:
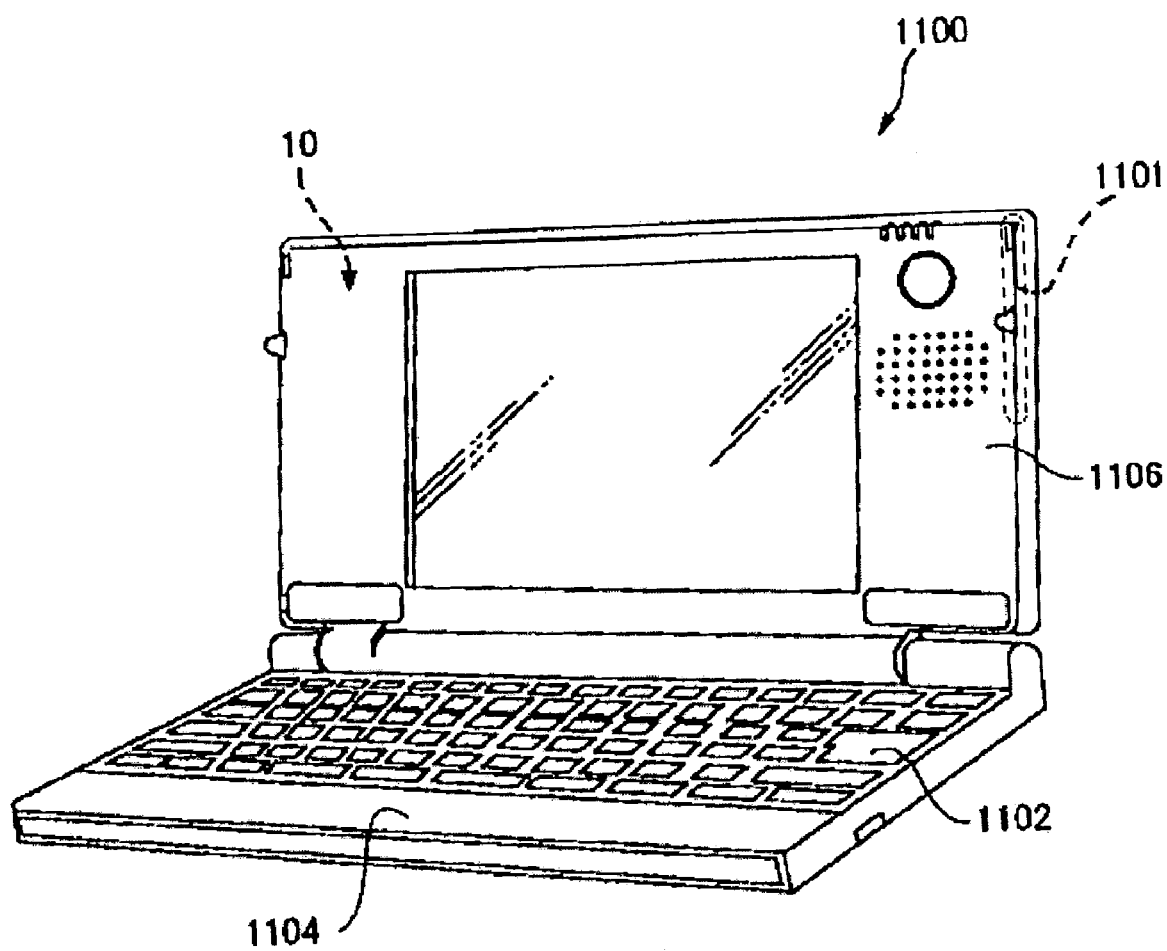
FIG. 6 is a perspective view which shows a structure of a mobile (or laptop type) personal computer to which an electronic apparatus provided with the surface acoustic wave device of the present invention is applied.

FIG. 6 is a perspective view which shows a structure of a mobile (or laptop type) personal computer to which an electronic apparatus provided with the surface acoustic wave device of the present invention is applied. Referring to FIG. 6, a personal computer 1100 is provided with a body 1104 having an antenna 1101 and a keyboard 1102, and a display unit 1106. The display unit 1106 is rotatably supported on the body 1104 via a hinge portion. A surface acoustic wave device 10 functioning as a filter, a resonator, a reference clock and the like is embedded in such a personal computer 1100. Further, in such a personal computer 1100, it is possible to apply a component of the present invention to the body 1104.

Figure 7:
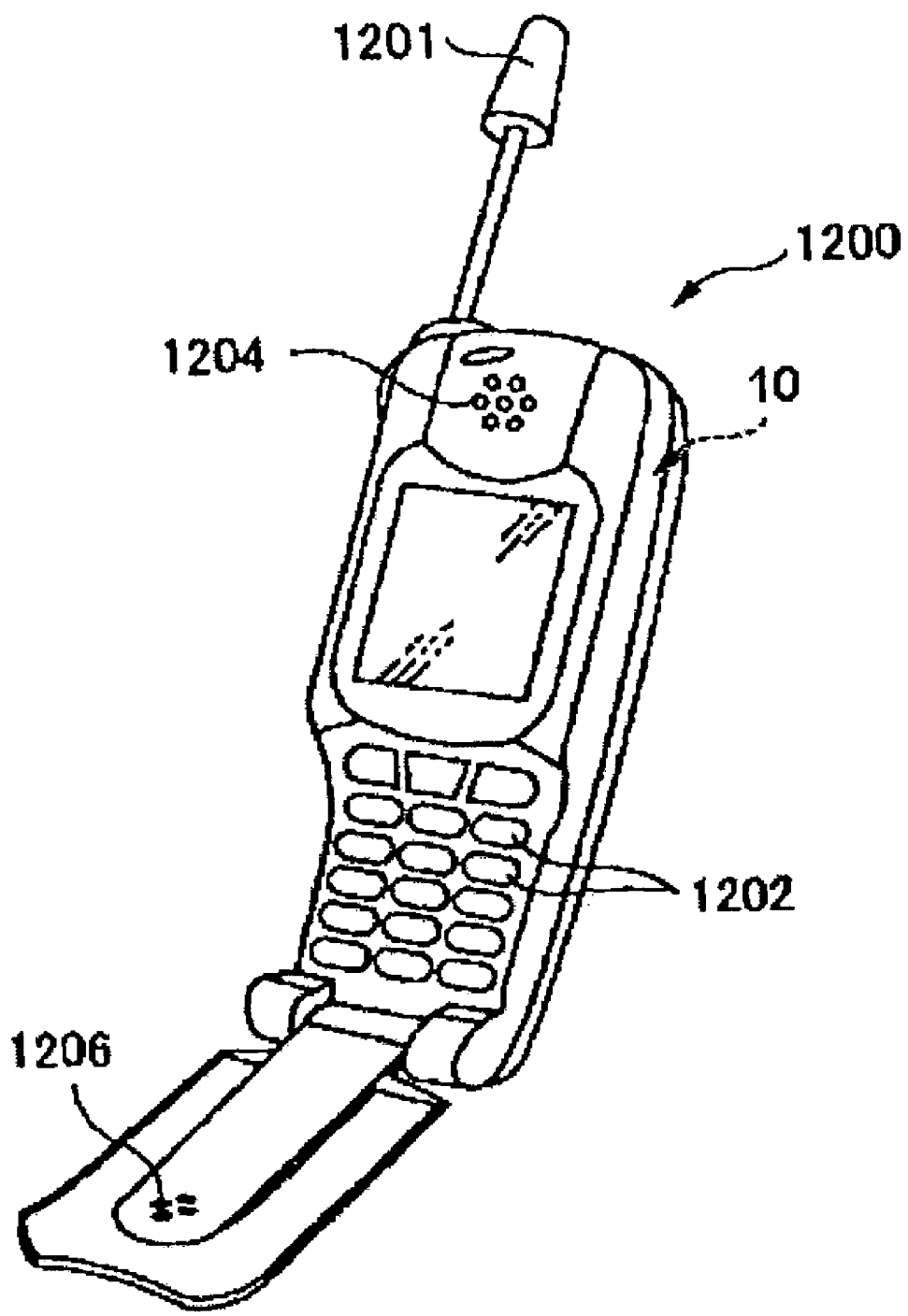
FIG. 7 is a perspective view which shows a structure of a portable phone (including a personal handy phone system) to which an electronic apparatus provided with the surface acoustic wave device of the present invention is applied.

FIG. 7 is a perspective view which shows a structure of a portable phone (including a personal handy phone system) to which an electronic apparatus provided with the surface acoustic wave device of the present invention is applied. Referring to FIG. 7, a portable phone 1200 is provided with an antenna 1201, a plurality of buttons 1202, an earpiece 1204, a mouthpiece 1206, and a display portion. The display portion is arranged between the plurality of buttons 1202 and the earpiece 1204. A surface acoustic wave device 10 functioning as a filter, a resonator and the like is embedded in such a portable phone 1200. Further, in such a portable phone 1200, it is possible to apply a component of the present invention to the body thereof.

Figure 8:
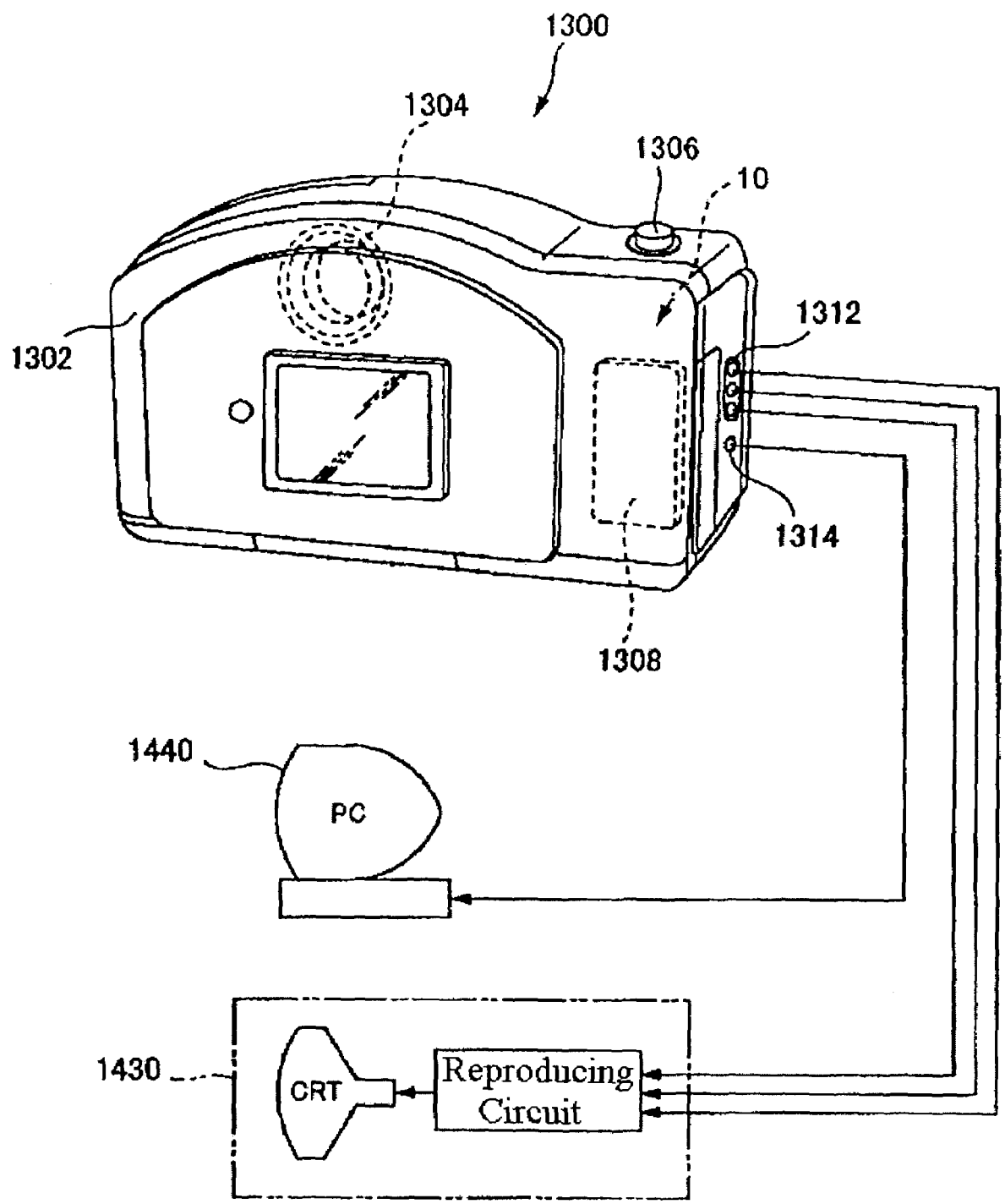
FIG. 8 is a perspective view which shows a structure of a digital still camera to which an electronic apparatus provided with the surface acoustic wave device of the present invention is applied.

FIG. 8 is a perspective view which shows a structure of a digital still camera to which an electronic apparatus provided with the surface acoustic wave device of the present invention is applied. In this drawing, connection of the digital still camera to external equipments thereof is schematically shown. A normal camera exposes a silver salt photographic film on the basis of an optical image of a subject, while the digital still camera 1300 generates an imaging signal (image signal) by photoelectrically converting an optical image of a subject into the imaging signal with imaging device such as a charge coupled device (CCD).

A display portion is provided on the back surface of a case (body) 1302 in the digital still camera 1300. The display portion displays an image in response to an imaging signal by the CCD, and serves as a finder for displaying a subject as an electronic image.

Further, a light receiving unit 1304 including an optical lens (imaging optical system), the CCD, and the like is provided in the front surface side of the case 1302. When a photographer confirms an image of a subject displayed on the display portion, and pushes a shutter button 1306, an imaging signal of the CCD at the time is transferred to a memory 1308 and stored in this memory 1308.

Further, a video signal output terminal 1312 and an input/output terminal 1314 for data communication are provided on the side surface of the case 1302 in the digital still camera 1300. As shown in FIG. 8, a television monitor 1430 and a personal computer 1440 are respectively connected to the video signal output terminal 1312 and the input/output terminal 1314 for data communication if needed. Moreover, the imaging signal stored in the memory 1308 is outputted to the television monitor 1430 or the personal computer 1440 with a predetermined operation. A surface acoustic wave device 10 functioning as a filter, a resonator and the like is embedded in such a digital still camera 1300. In such a digital still camera 1300, it is possible to apply a component of the present invention to the case (body) 1302 thereof.

In this regard, the electronic apparatus provided with the surface acoustic wave device of the present invention can be suitably used in (or applied to), for example, ink jet type ejection apparatuses (such as ink jet printers), laptop type personal computers, car navigation devices, pagers, electronic notebooks (including those having communication functions), electronic dictionaries, pocket calculators, electronic game devices, word processors, work stations, television telephones, television monitors for crime prevention, electronic binoculars, POS (point-of-sale) terminals, medical devices (electronic thermometers, blood pressure meters, blood sugar meters, electrocardiogram measuring devices, ultrasound diagnostic devices, electronic endoscopes, for example), fish finders, various measurement devices, gauges (gauges for vehicles, airplanes, ships and the like, for example), flight simulators, and the like, in addition to the personal computer (mobile personal computer) 1100 shown in FIG. 6, the portable phone 1200 shown in FIG. 7 and the digital still camera 1300 shown in FIG. 8.

The method of forming an oxide film, the oxide film, the component and the electronic apparatus according to the present invention have been described based on the embodiments shown in the drawings, but it should be noted that the present invention is not limited to the embodiments. For example, other one or more step for an arbitrary object can be added to the method of forming an oxide film according to the present invention.

EXAMPLE

Next, a concrete example of the present invention will be described.

1. Formation of Film

Example 1

<1> First, an Al film (base) having an average thickness of 200 nm was formed on the surface of a glass substrate by means of a vacuum evaporation method to prepare a processed member.

<2> Next, the processed member was immersed in a NaOH aqueous solution of 5% by weight (at the temperature of 22° C.) for 20 seconds. The processed member was then wet-cleaned for 5 minutes, and dried by spraying a nitrogen gas thereto.

<3> Next, process liquid containing ethanol of 99.5% by weight was dropped onto the surface of the processed member (Al film) at room temperature so as to be spread all over the Al film, whereby a liquid film was formed thereon.

<4> Next, the processed member on which the liquid film was formed was left at room temperature for 20 hours, whereby a film was formed on the surface of the processed member.

Example 2

By carrying out the steps as well as Example 1 described above except that the steps <3> and <4> were carried out as follows, a film was formed on the processed member. Namely, in Example 2, a process liquid containing ethanol of 99.5% by weight was dropped onto the surface of the processed member (Al film) while heating the processed member at 300° C. with a heater so as to be spread all over the Al film, whereby a liquid film was formed thereon. In this regard, this operation of dropping the process liquid was repeatedly carried out at 20-second intervals for 10 minutes.

Next, the processed member on which the liquid film was formed was left at room temperature for 10 hours.

Example 3

By carrying out the steps as well as Example 1 described above except that the steps <3> and <4> were carried out as follows, a film was formed on the processed member. Namely, in Example 3, a process liquid containing trifluoroethanol of 99% by weight was dropped onto the surface of the processed member (Al film) while heating the processed member at 300° C. with a heater so as to be spread all over the Al film, whereby a liquid film was formed thereon. In this regard, this operation of dropping the process liquid was repeatedly carried out at 20-second intervals for 10 minutes.

Next, the processed member on which the liquid film was formed was left at room temperature for 5 hours.

Example 4

By carrying out the steps as well as Example 1 described above except that the steps <3> and <4> were carried out as follows, a film was formed on the processed member. Namely, in Example 4, a process liquid containing ethylene glycol of 99% by weight was dropped onto the surface of the processed member (Al film) while heating the processed member at 300° C. with a heater so as to be spread all over the Al film, whereby a liquid film was formed thereon. In this regard, this operation of dropping the process liquid was repeatedly carried out at 30-second intervals for 20 minutes.

Next, the processed member on which the liquid film was formed was left at room temperature for 40 hours.

Example 5

By carrying out the steps as well as Example 4 described above except that the processed member on which the liquid film was formed was left for 20 hours while heating it at 100° C., a film was formed on the processed member.

Example 6

By carrying out the steps as well as Example 1 described above except that the steps <3> and <4> were carried out as follows, a film was formed on the processed member. Namely, in Example 6, a process liquid containing glycerin of 99% by weight was dropped onto the surface of the processed member (Al film) while heating the processed member at 300° C. with a heater so as to be spread all over the Al film, whereby a liquid film was formed thereon. In this regard, this operation of dropping the process liquid was repeatedly carried out at 30-second intervals for 20 minutes.

Next, the processed member on which the liquid film was formed was left at room temperature for 40 hours.

Example 7

By carrying out the steps as well as Example 6 described above except that the processed member on which the liquid film was formed was left for 20 hours while heating it at 150° C., a film was formed on the processed member.

Example 8

By carrying out the steps as well as Example 1 described above except that the steps <3> and <4> were carried out as follows, a film was formed on the processed member. Namely, in Example 8, a process liquid containing ethylene glycol of 49.5% by weight and ethanol of 49.5% by weight was dropped onto the surface of the processed member (Al film) while heating the processed member at 300° C. with a heater so as to be spread all over the Al film, whereby a liquid film was formed thereon. In this regard, this operation of dropping the process liquid was repeatedly carried out at 30-second intervals for 20 minutes.

Next, the processed member on which the liquid film was formed was left at room temperature for 20 hours.

Example 9

By carrying out the steps as well as Example 1 described above except that except that the step <2> described above was omitted, a film was formed on the processed member. Namely, in Example 9, the step <3> was carried out right after the step <1>.

Example 10

By carrying out the steps as well as Example 1 described above except that except that the step <2> described above was omitted, a film was formed on the processed member. Namely, in Example 10, the processed member was kept in pure nitrogen atmosphere after the step <1>, and the step <3> was then carried out.

Example 11

By carrying out the steps as well as Example 1 described above except that the step <2> was carried out as follows, a film was formed on the processed member. Namely, in Example 11, the processed member was immersed in an HCl aqueous solution of 36% by weight (at the temperature of 22° C.) for 30 seconds. The processed member was then wet-cleaned for 5 minutes, and dried by spraying a nitrogen gas thereto.

Example 12

By carrying out the steps as well as Example 1 described above except that the step <2> was carried out as follows, a film was formed on the processed member. Namely, in Example 12, the processed member was immersed in an HF aqueous solution of 2.4% by weight (at the temperature of 22° C.) for 10 seconds. The processed member was then wet-cleaned for 5 minutes, and dried by spraying a nitrogen gas thereto.

Example 13

By carrying out the steps as well as Example 1 described above except that the step <2> was carried out as follows, a film was formed on the processed member. Namely, in Example 13, the processed member was exposed to vapor of an HCl aqueous solution of 36% by weight (at the temperature of 22° C.) for 5 minutes. The processed member was then dried on a hot plate of 50° C. for 5 minutes.

Example 14

By carrying out the steps as well as Example 1 described above except that the step <2> was carried out as follows, a film was formed on the processed member. Namely, in Example 14, the processed member was exposed to vapor of an HF aqueous solution of 50% by weight (at the temperature of 22° C.) for 20 seconds. The processed member was then dried on a hot plate of 50° C. for 5 minutes.

Example 15

By carrying out the steps as well as Example 1 described above except that the step <2> was carried out as follows, a film was formed on the processed member. Namely, in Example 15, the processed member was wet-cleaned for 5 minutes, and dried by spraying a nitrogen gas thereto.

Example 16

By carrying out the steps as well as Example 1 described above except that the step <2> was carried out as follows, a film was formed on the processed member. Namely, in Example 16, the processed member was exposed to water vapor (at the temperature of 60° C.) for 15 minutes.

Example 17

By carrying out the steps as well as Example 1 described above except that the step <2> was carried out as follows, a film was formed on the processed member. Namely, in Example 17, the surface of the processed member was subjected to a plasma process under atmospheric pressure. In this regard, the conditions for the plasma process were as follows. The rate of flow of He was 10 L per minute, the high frequency output thereof was 500 W, the distance between the electrode and the processed member was 1 mm, and the delivering velocity of the processed member was 1 mm per second.

2. Analysis of Chemical Composition of Film

The analysis of chemical composition for the films manufactured in each of Examples was carried out using TOF-SIMS (Time of Flight Secondary Ion Mass Spectroscopy). As a result, aluminum element and oxygen element were detected in every film, and it is confirmed that every film was an oxide film constituted from aluminum oxide.

In this regard, in place of the aluminum film, each of a Ta film, a Ti film, a Mn film, a Sb film, a Fe film, a Cu film, a W film, a Mo film, a Sc film, an Al—Cu alloy film, a Si film, a Ge film, a Ga—Si compound semiconductor film was formed on the processed member. A film was then formed on the surface of each of the processed members thus manufactured as well as Examples 1 to 17 described above. The analysis of chemical composition for the films thus manufactured was carried out. It is confirmed that each of the formed films was an oxide film constituted from an oxide corresponding to each of metals and semiconductors.

What is claimed is:

1. A method of forming an oxide film on a surface of a base material constituted from an inorganic material, the oxide film being constituted from a material containing an oxide of the inorganic material as a major component thereof, the method comprising:

preparing the base material;

subjecting the surface of the base material to surface treatment, wherein the subjecting the surface of the base material to surface treatment includes applying moisture onto the surface of the base material and bringing the surface at the base material into contact with plasma;

supplying a process liquid containing alcohol onto the surface of the base material to form a liquid film of the process liquid thereon after the surface treatment has been carried out;

producing an oxide of the inorganic material through a reaction of the inorganic material with the alcohol in the liquid film; and eliminating the process liquid remaining in the liquid film to form the oxide film on the surface of the base material.

2. The method as claimed in claim 1, wherein in the supplying step the process liquid is supplied onto the surface of the base material while heating the base material.

3. The method as claimed in claim 1, wherein the alcohol includes at least one of a monohydric alcohol, a dihydric alcohol and a trihydric alcohol.

4. The method as claimed in claim 1, wherein the number of carbon atoms in one alcohol molecule of the alcohol is in the range of one to six.

5. The method as claimed in claim 1, wherein at least a part of hydrogen atoms included in a molecule of the alcohol other than a hydroxyl radical therein are replaced with fluorine atoms.

6. The method as claimed in claim 1, wherein the concentration of the alcohol in the process liquid is 95% by weight or more.

7. The method as claimed in claim 1, further comprising forming a mask on the surface of the base material prior to the process liquid supplying step, the mask having an opening with a predetermined shape that corresponds to the shape of the oxide film to be formed.

8. The method as claimed in claim 7, wherein the mask includes a resist layer constituted from a resist material as a main material.

9. The method as claimed in claim 7, further comprising subjecting the surface of the base material with the mask to surface treatment after the mask forming step.

10. The method as claimed in claim 1, wherein in the process liquid eliminating step the process liquid remaining in the liquid film is eliminated at room temperature or while heating the base material.

11. The method as claimed in claim 1, wherein the inorganic material includes at least one of metal and semiconductor.

12. The method as claimed in claim 1, further comprising subjecting the oxide film to a sealing process after the elimination of the process liquid remaining in the liquid film.

13. The method as claimed in claim 1, wherein the inorganic material includes aluminum (Al).

14. The method as claimed in claim 13, wherein the alcohol includes a monohydric alcohol (R—OH), the oxide of the aluminum (Al) is produced through the following reactions (1) to (3)

$$2Al + 6R\text{—}OH \rightarrow 2Al(O\text{—}R)_3 + 3H_2 \quad (1)$$

$$2Al(O\text{—}R)_3 + 6H_2 \rightarrow 2Al(OH)_3 + 6R\text{—}H \quad (2)$$

$$2Al(OH)_3 \rightarrow Al_2O_3 \cdot H_2O + 2H_2O. \quad (3)$$

* * * * *